United States Patent [19]
Bair et al.

[11] Patent Number: 6,066,178
[45] Date of Patent: *May 23, 2000

[54] AUTOMATED DESIGN METHOD AND SYSTEM FOR SYNTHESIZING DIGITAL MULTIPLIERS

[75] Inventors: Owen S. Bair, Saratoga; Fang-Hsing Chen, Sunnyvale, both of Calif.

[73] Assignee: LSI Logic Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/630,257

[22] Filed: Apr. 10, 1996

[51] Int. Cl.⁷ .................................................. G06F 17/50
[52] U.S. Cl. ................. 716/2; 716/5; 716/6; 716/18; 716/4; 708/626; 708/625
[58] Field of Search ................................. 364/488–491; 708/626, 625; 395/500.03, 500.02, 500.06, 500.05, 500.07, 500.19

[56] References Cited

U.S. PATENT DOCUMENTS

| | | | |
|---|---|---|---|
| 4,575,812 | 3/1986 | Kloker et al. | 708/630 |
| 4,752,905 | 6/1988 | Nakagawa et al. | 708/629 |
| 4,972,362 | 11/1990 | Elkind et al. | 708/632 |
| 4,979,018 | 12/1990 | Tanaka | 708/625 |
| 5,181,185 | 1/1993 | Han et al. | 708/628 |
| 5,197,015 | 3/1993 | Hartoog et al. | 395/500.13 |
| 5,231,601 | 7/1993 | Stearns | 708/625 |
| 5,251,167 | 10/1993 | Simmonds et al. | 708/630 |
| 5,282,148 | 1/1994 | Poirot et al. | 395/500.07 |
| 5,313,414 | 5/1994 | Yang et al. | 708/625 |
| 5,340,771 | 8/1994 | Rostoker | 29/827 |
| 5,340,772 | 8/1994 | Rostoker | 438/460 |
| 5,341,024 | 8/1994 | Rostoker | 257/620 |
| 5,351,206 | 9/1994 | Yang et al. | 708/625 |
| 5,377,122 | 12/1994 | Werner et al. | 395/500.19 |
| 5,412,591 | 5/1995 | Bapst | 708/625 |
| 5,424,971 | 6/1995 | Yang et al. | 708/625 |
| 5,463,563 | 10/1995 | Bair et al. | 395/500.12 |
| 5,469,366 | 11/1995 | Yang et al. | 395/500.07 |
| 5,477,466 | 12/1995 | Tripathi et al. | 395/500.22 |
| 5,541,849 | 7/1996 | Rostoker et al. | 395/500.19 |
| 5,598,344 | 1/1997 | Dangelo et al. | 395/500.19 |
| 5,798,956 | 8/1998 | Park | 708/626 |
| 5,818,743 | 10/1998 | Lee et al. | 708/628 |
| 5,898,595 | 4/1999 | Bair et al. | 395/500.03 |

OTHER PUBLICATIONS

Martel et al "Design Strategies for Optimal Multiplier Circuits," IEEE, pp. 42–49, Jul. 1995.

(List continued on next page.)

*Primary Examiner*—Paul R. Lintz
*Assistant Examiner*—Vuthe Siek

[57] ABSTRACT

A computer-based method and system is disclosed that automates the design and layout of digital multiplier circuits. The preferred method utilizes an automatic design generator having a user interface which receives design requirements for a digital multiplier circuit design. A digital multiplier design generator receives the design requirements for the digital multiplier and retrieves relevant component implementations from a component library. Stored digital multiplier benchmarks are then retrieved from a benchmark memory and applied to corresponding digital multipliers to determine which of the various implementations optimally satisfies the user design requirements. Once the optimal digital multiplier implementation is selected, the digital multiplier design generator produces a logic design including a netlist and a physical design including design directives which are then used to place and route the digital multiplier as a finished layout. Once the layout is completed, the finished layout simulation results are then evaluated against the benchmark results to determine if the actual implementation meets the user requirements. If the user requirements are not met by the actual implementation, then information for generating another implementation is fed back to the digital multiplier design generator.

18 Claims, 8 Drawing Sheets

OTHER PUBLICATIONS

David W. Knapp "Fasolt: A Program for Feedback–Driven Data–Path Optimization," IEEE, pp. 677–695, Jun. 1992.

Kawahito et al. "High–Speed Area–Efficient Multiplier Design Using Multiple–Valued Current–Mode Circuits," IEEE, Jan. 1994, pp. 34–42.

M. Morris Mano, "Digital Design" 1984, by Prentice–Hall, Inc., Englewood Cliffs, New Jersey 07632.

C. Duvvury et al., "Dynamic Gate Coupling of NMOS For Efficient Output ESD Protection," IEEE Proceedings of the IRP, Sanvary, 1992, pp. 141–150.

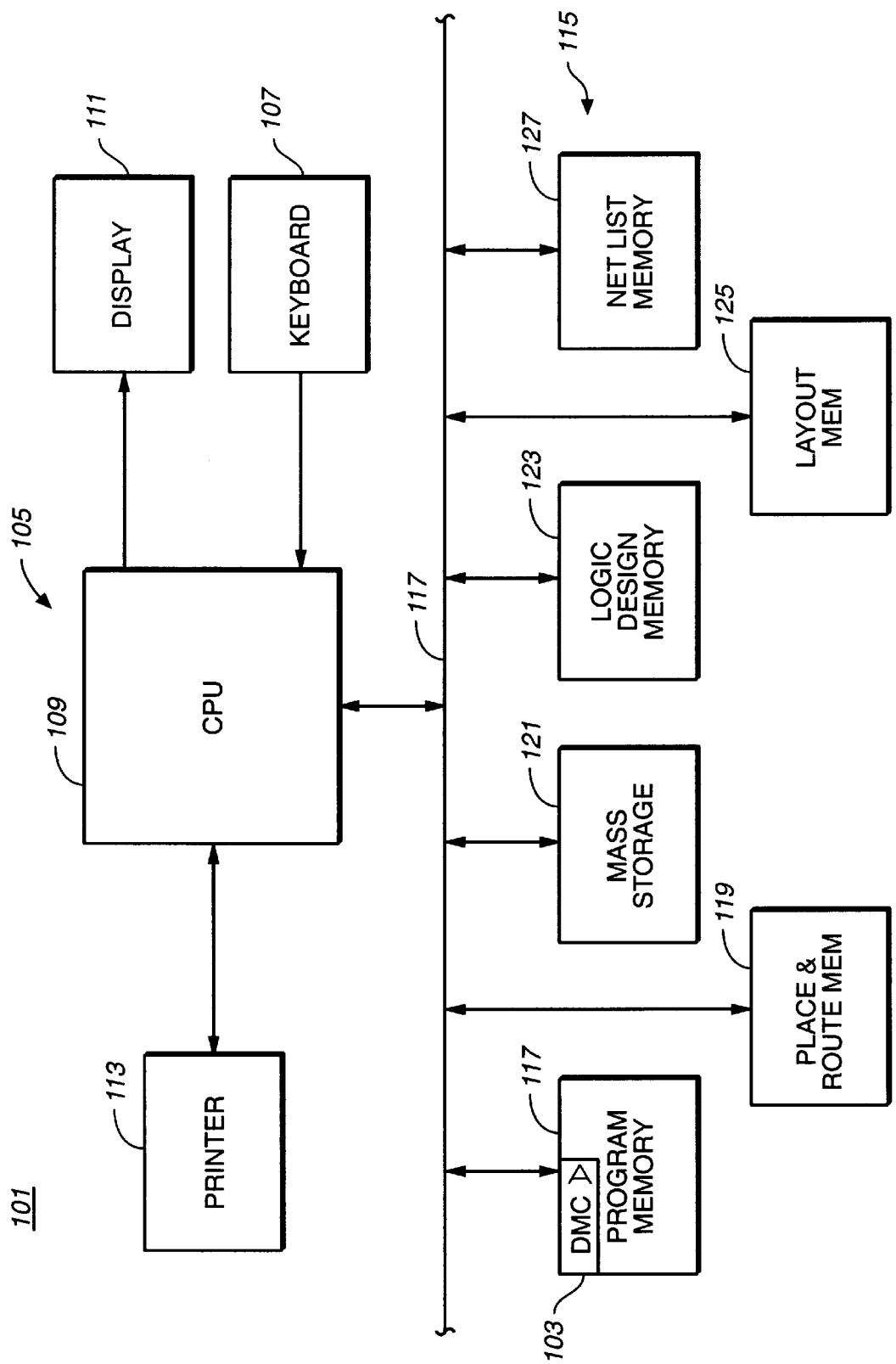

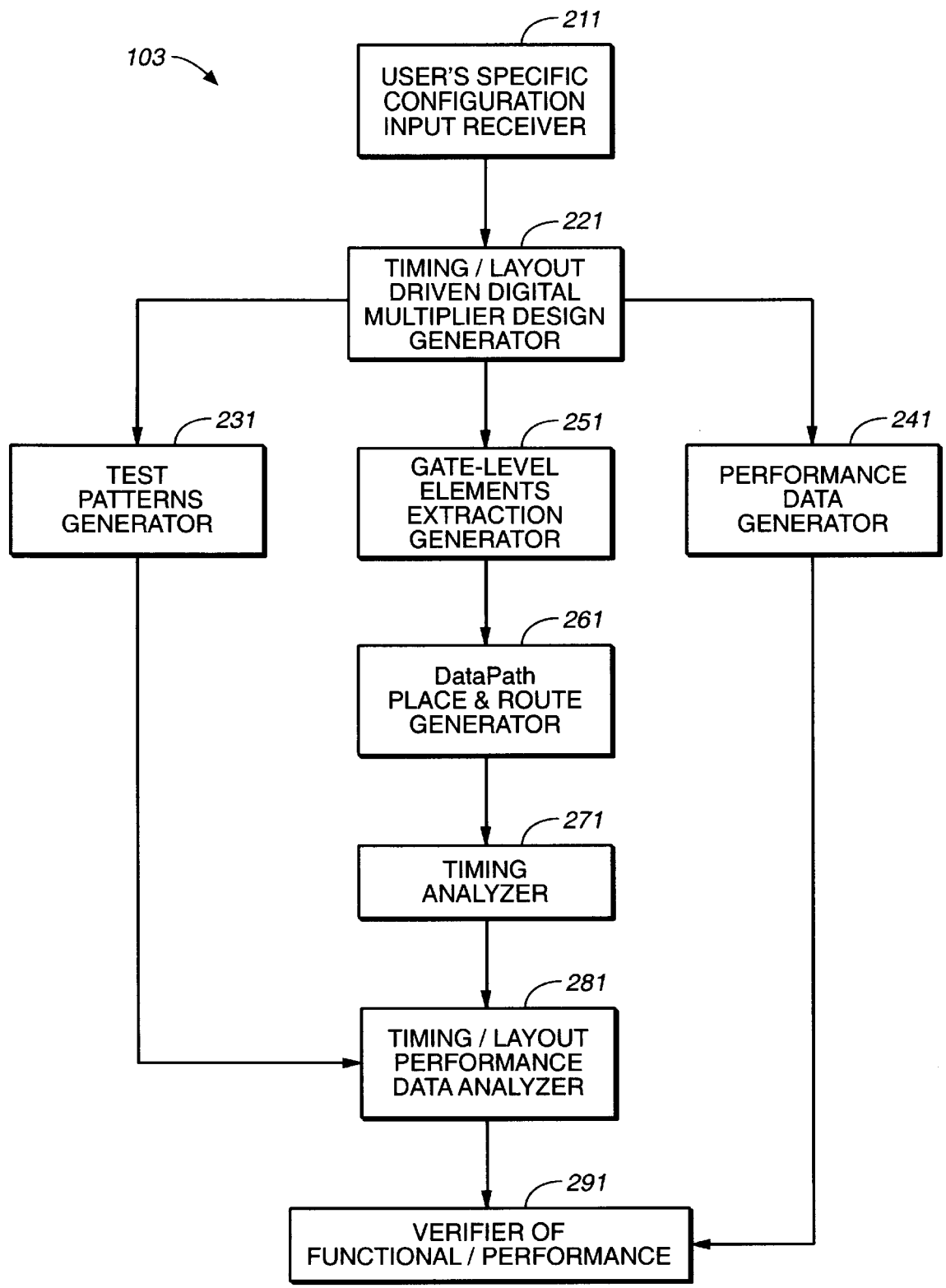
FIG._2

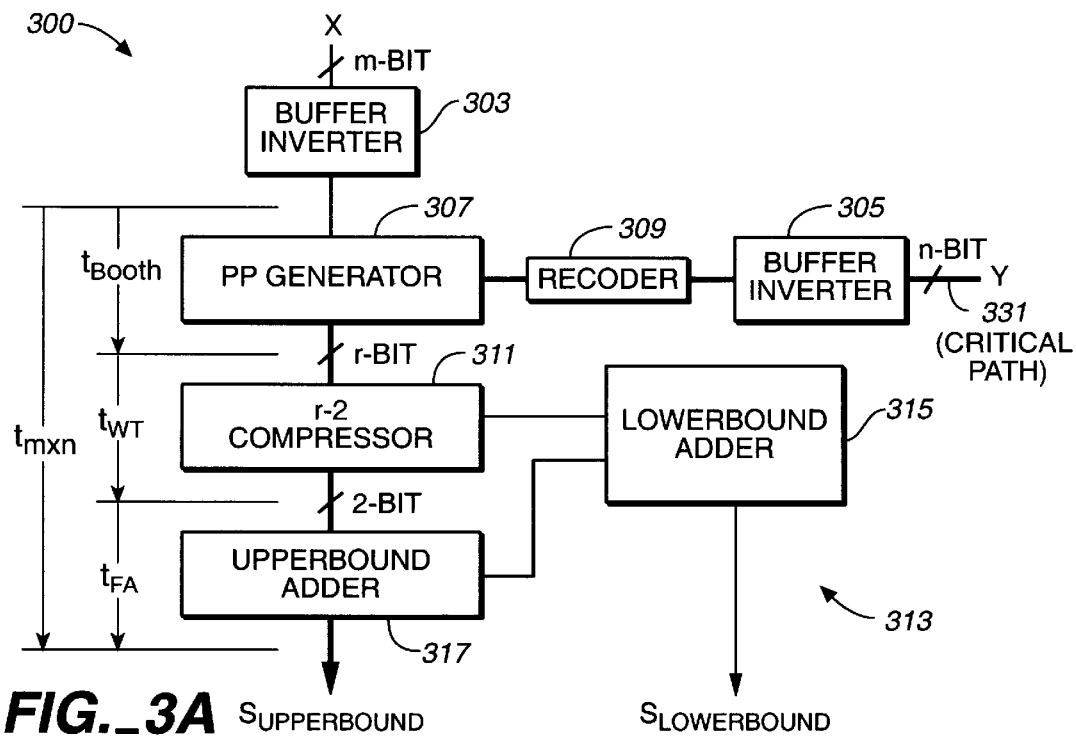
FIG._3A
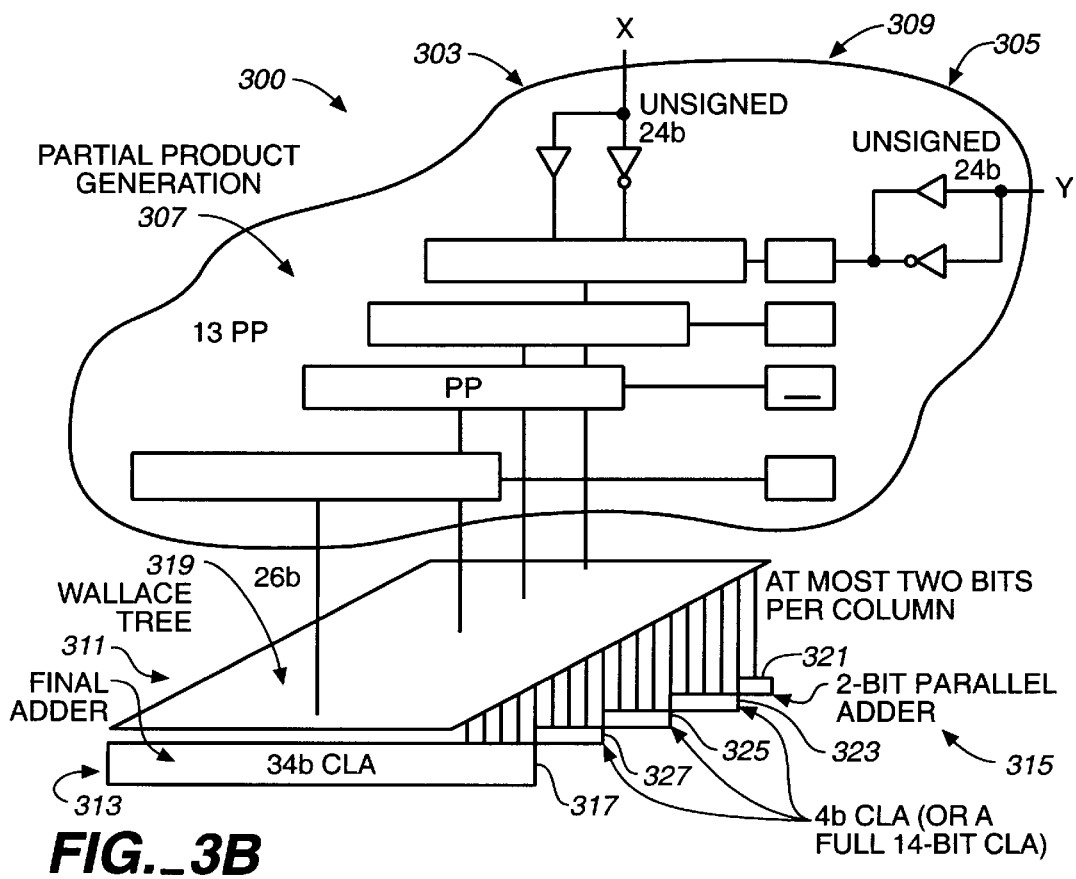
FIG._3B

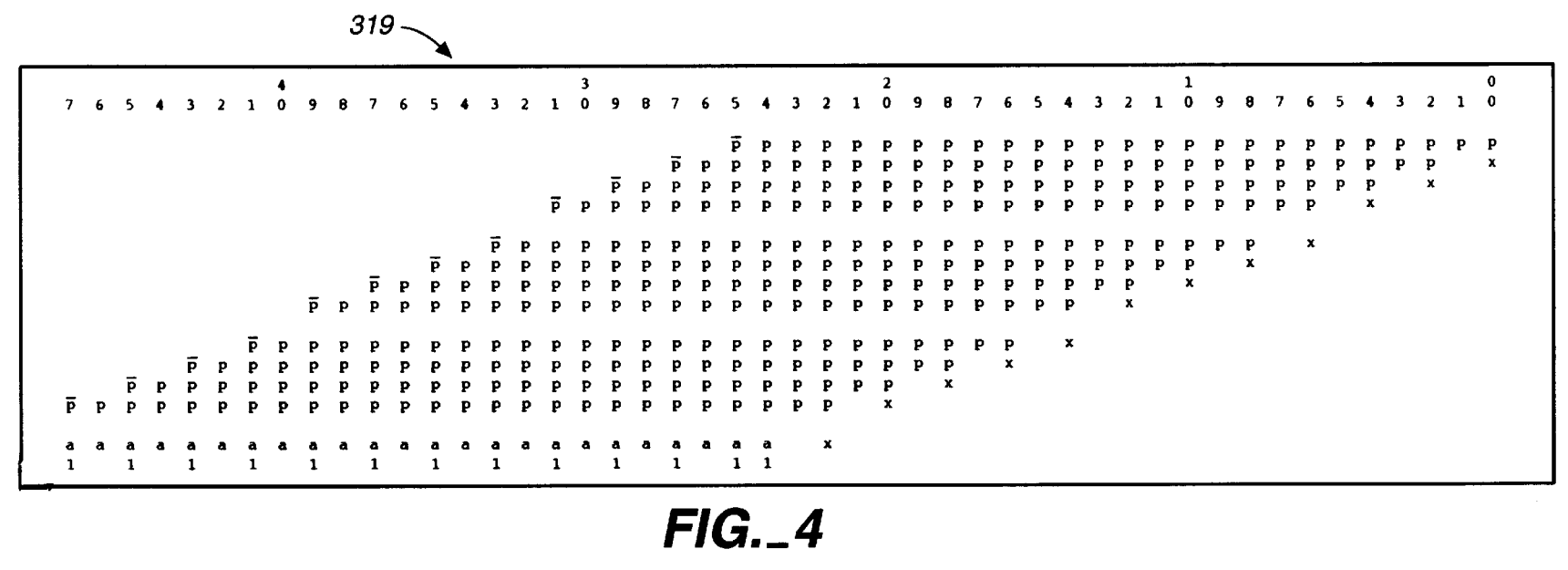

FIG._4

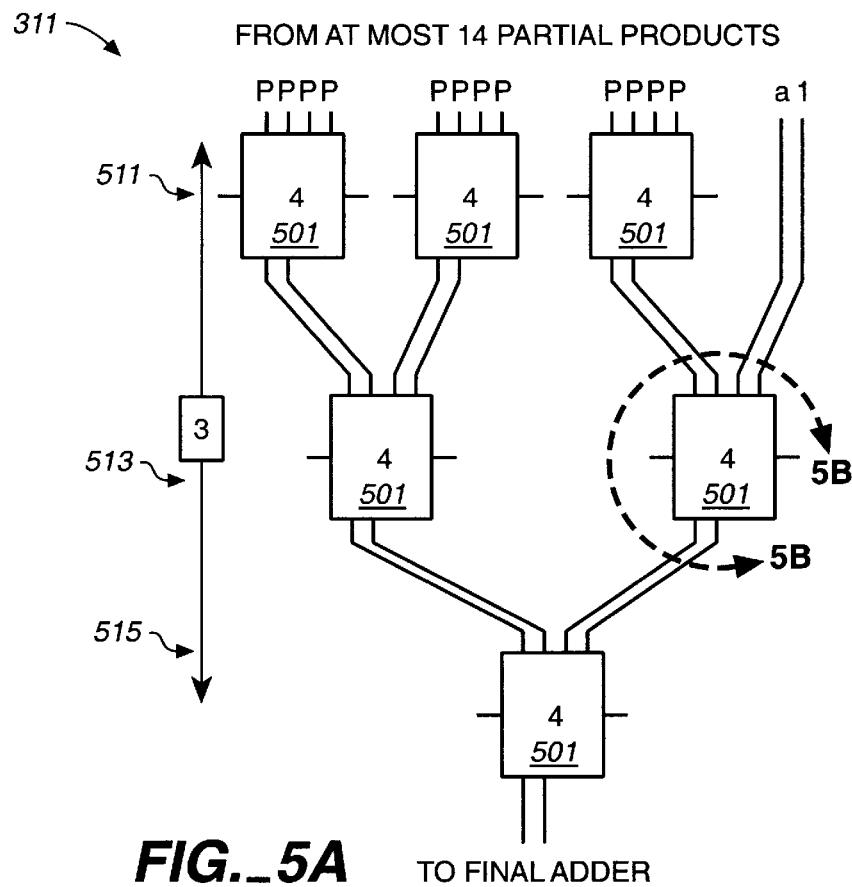
FIG._5A
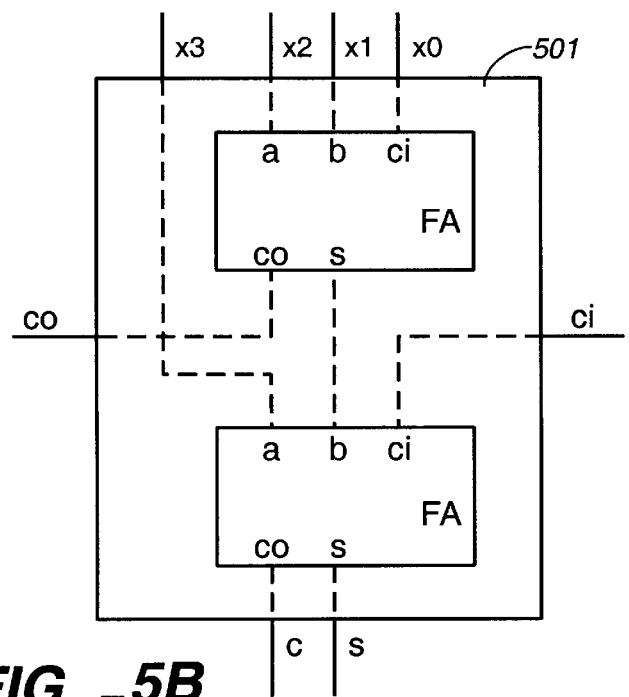
FIG._5B

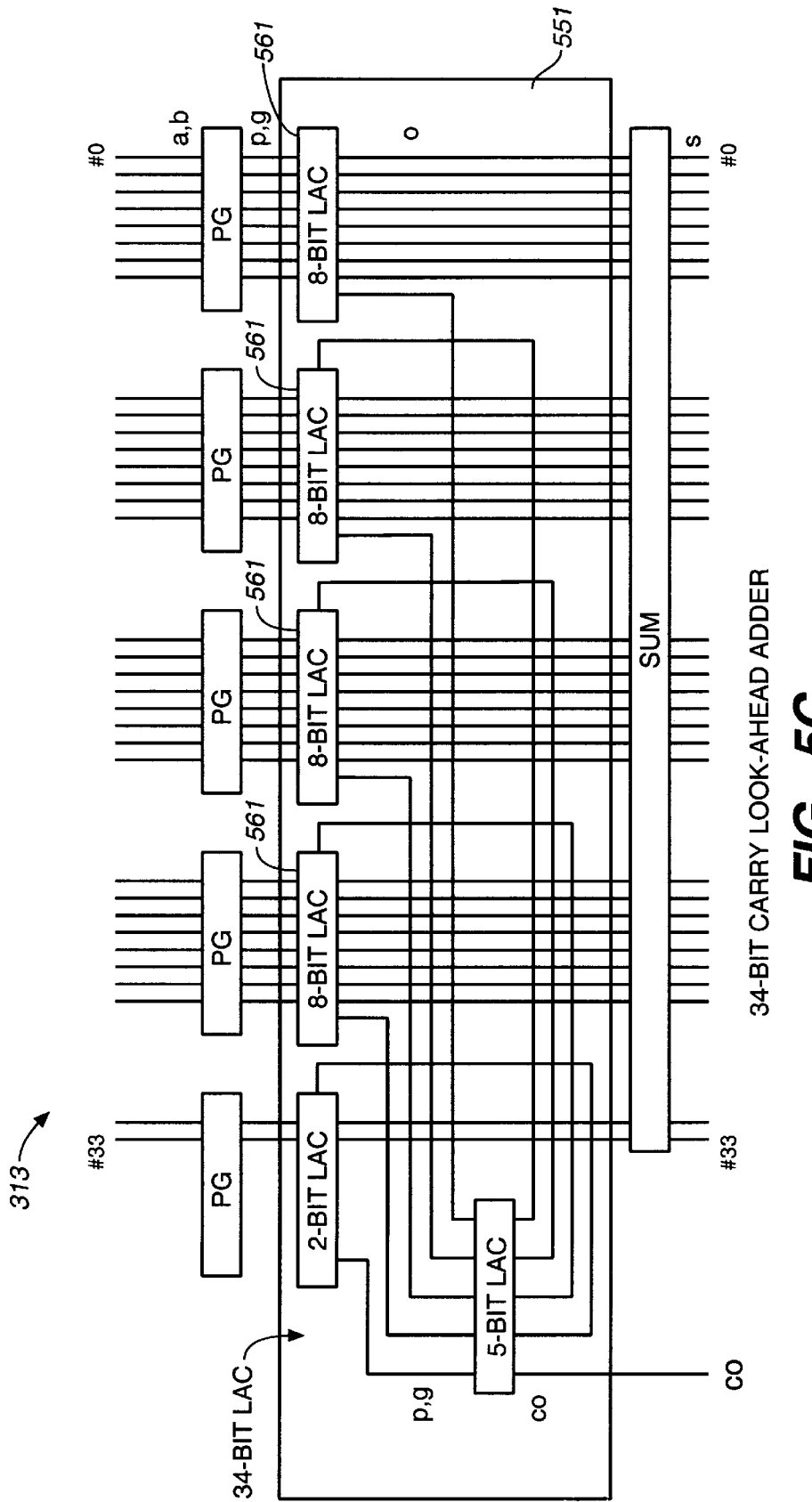
FIG._5C

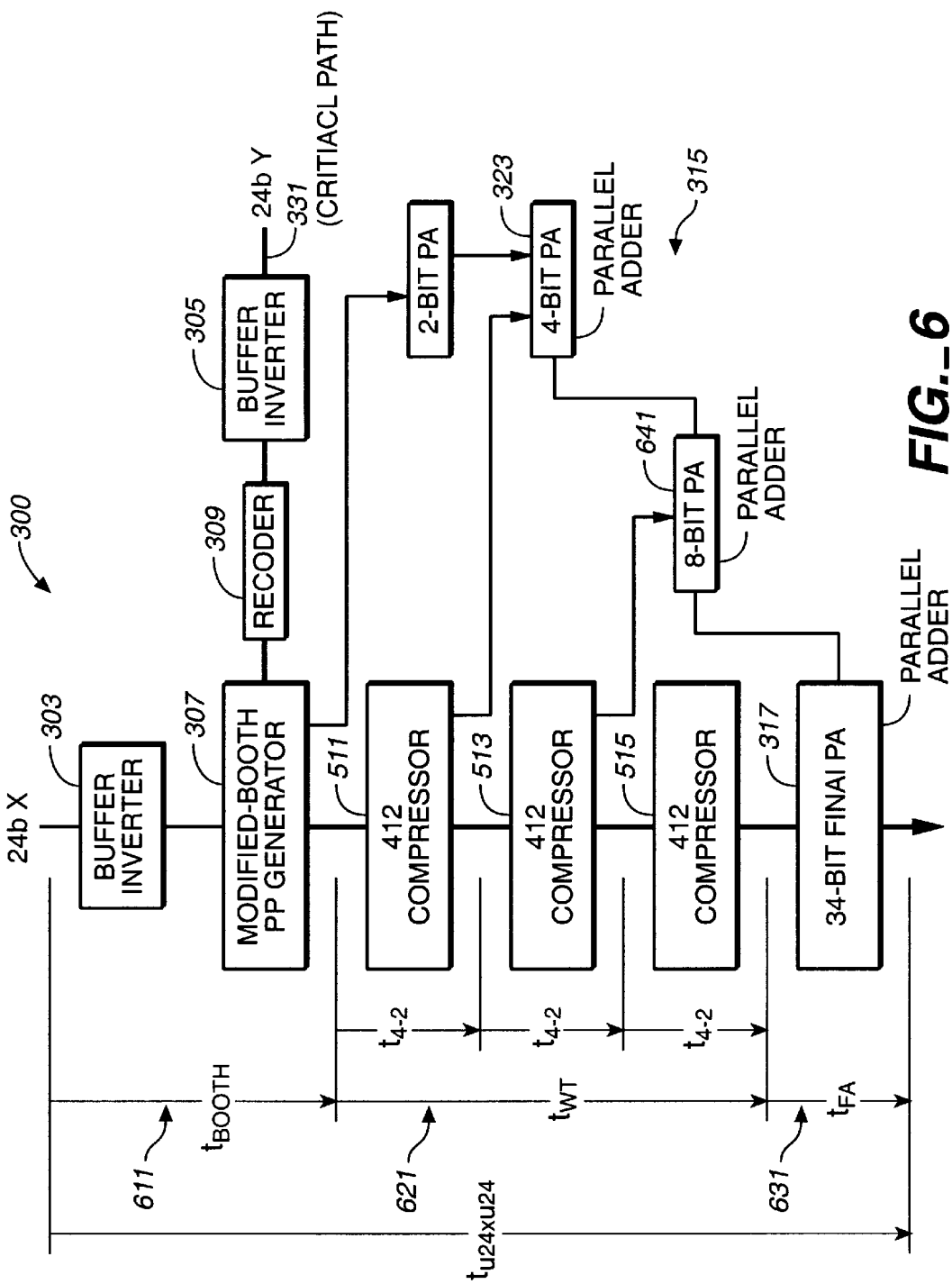
FIG._6

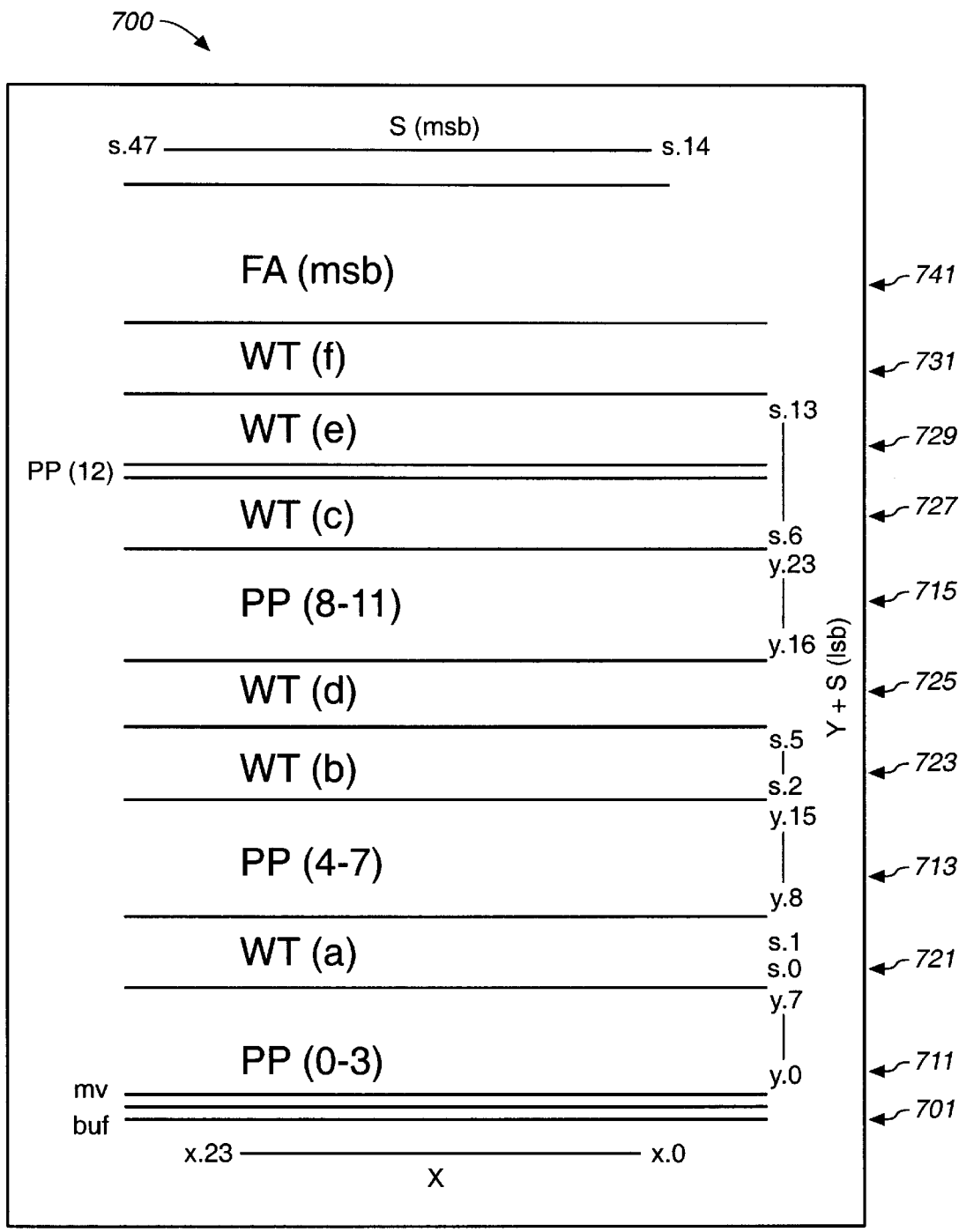
FIG._7

AUTOMATED DESIGN METHOD AND SYSTEM FOR SYNTHESIZING DIGITAL MULTIPLIERS

FIELD OF THE INVENTION

This invention relates generally to automated design and synthesis of digital multipliers, and more particularly to an automated design method and system for optimally synthesizing digital multipliers.

BACKGROUND OF THE INVENTION

Certain known computer-aided design (CAD) techniques have been developed to aid in the synthesis of integrated circuits including integrated logic circuits. Such techniques have included simulating the operation of proposed circuit designs and producing netlists (detailed circuit specifications including circuit components, also referred to as cells, from a pre-defined library, and interconnections, also referred to as nodes, between the cells), as with Microcap, Spice or similar programs. Such techniques have further included generating silicon layouts including routing from netlists of proposed circuit designs and developing sets of semiconductor masks from the silicon layout for later utilization in semiconductor chip production equipment, as with a silicon compiler.

The aforementioned techniques have been utilized in computer-aided integrated circuit design systems for the synthesis of integrated logic circuits; however, with respect to digital multiplier design, manual intervention is frequently required by multiple design specialists within a circuit design team.

Design intervention is time consuming and requires specialists who are highly knowledgeable both in circuit design and in the placement and routing of integrated circuits.

Therefore, there is a need for an automated design method and system which generates a digital multiplier circuit design and layout from design specifications inserted at the logic level without the need for design intervention.

SUMMARY OF THE INVENTION

In accordance with the present invention, a digital multiplier circuit design process is implemented on an automated system to generate optimized digital multiplier designs and layouts based upon user specifications.

The user specifications are utilized by a digital multiplier design generator to produce those digital multiplier design solutions which are implementable with available or designable components according to accessible data or programming. The possible design solutions are analyzed by the design generator to select a preferred or optimal design solution based upon the user specifications or programming and which has processing time constraints along a critical path. Once the optimal digital multiplier design is selected, the design generator produces a logic design including a netlist, a physical design including design directives, performance data, and timing data. The logic and physical designs are then used by a layout generator to place and route the digital multiplier as a finished layout. Once the layout is completed, the finished layout is simulated and tested to obtain test data. The test data is compared with the performance and timing data to determine whether the finished layout meets the user specifications. If all user specifications are met, then the finished layout is approved for use in developing a set of silicon masks by a silicon compiler and later fabrication; otherwise, the timing and performance comparison data is returned to the digital multiplier design generator and the design and testing procedures are repeated to produce an alternative optimized digital multiplier design solution.

In accordance with the present invention, digital multipliers are produced utilizing the automated digital multiplier circuit design process.

BRIEF DESCRIPTION OF THE DRAWINGS

FIG. 1 is a block diagram of a computer system for performing the digital multiplier circuit design process according to the present invention.

FIG. 2 is a block diagram of the digital multiplier circuit designer for generating the design and layout of digital multiplier circuits in accordance with the present invention.

FIG. 3A is a block diagram of a general digital multiplier architecture which may be designed in accordance with the invention.

FIG. 3B is a block diagram of an unsigned 24-bit by unsigned 24-bit digital multiplier architecture which may be designed in accordance with the invention.

FIG. 4 is a logic level, Wallace Tree structure comprising a modified-Booth, generic set of partial products which may be implemented within a digital multiplier designed in accordance with the invention such as the digital multiplier of FIG. 3B.

FIG. 5A is a block diagram of a '14-2' compressor architecture which may be implemented in the digital multiplier of FIG. 3B in accordance with the invention.

FIG. 5B is a block diagram of a 4-to-2-bit compressor circuit which may be utilized to synthesize the '14-2' compressor of FIG. 5A in accordance with the invention.

FIG. 5C is a block diagram of a 34-bit carry look-ahead adder circuit which may be utilized to synthesize the upper-bound adder in accordance with the invention.

FIG. 6 is a block diagram including a timing breakdown of a digital multiplier which may be designed in accordance with the invention.

FIG. 7 is a layout of the digital multiplier of FIG. 3B generated in accordance with the invention.

Like reference numerals refer to corresponding components throughout the several diagrams. The most significant digit of each reference numeral corresponds to the figure number wherein the reference numeral first appears and the associated component identified.

DETAILED DESCRIPTION OF THE PREFERRED EMBODIMENT

Referring now to FIG. 1, there is shown computer design system 101 including digital multiplier circuit designer (DMCD) 103, according to the present invention, for producing optimized timing designs and layouts of digital multipliers. Computer design system 101 may be implemented on conventional workstation or personal computer 105. According to the present invention, a digital multiplier design and layout is produced through the input of a desired multiplier logic specification on computer design system 101 and operation of digital multiplier circuit designer 103 by a design engineer.

Workstation 105 may be implemented on a conventional workstation, such as a Sun Workstation manufactured by Sun Microsystems. Workstation 105 includes keyboard 107 for receiving and transferring instructions and data from a design engineer to central processing unit (CPU) 109.

Through keyboard 107, the design engineer may input instructions to CPU 109 directing the operation of digital multiplier circuit designer 103 and user specifications for utilization by digital multiplier circuit designer 103 to produce an optimized digital multiplier design and layout. Responsive to the user's instructions and data, CPU 109 provides the user with visual information through display 111 and printer 113, such as computer generated, digital multiplier logic or physical design information, performance data, timing data, a netlist, or a layout.

Workstation 105 includes memory 115 which permanently or temporarily stores programs and data accessible by CPU 109 through bus 117. Memory 115 includes program memory 117 which stores various programs and/or subroutines (applications) of digital multiplier circuit designer 103 including design, datapath place and route, layout, simulation, and verifier applications.

Data from the aforenamed programs is correspondingly stored in logic design memory 123, netlist memory 127, place and route memory 119, layout memory 125, and mass storage 121. Mass storage 121 contains various data files which are used by the program memory 117 and digital multiplier circuit designer 103. The various data files may include a component (cell) library containing circuit descriptions and/or information of various available multiplier components, a benchmark memory containing various test case input and output values of various digital multipliers and components, timing and performance characteristics of various digital multipliers and components, and a physical design directives file containing physical design directives associated with various digital multipliers and components which may be utilized by digital multiplier circuit designer 103 to generate a digital multiplier design. Logic design memory 123 stores logic design data of a digital multiplier generated by digital multiplier circuit designer 103 and stores data and test results produced from the simulation and test of a finished layout of the digital multiplier design. Netlist memory 127 contains a netlist of the digital multiplier design generated by digital multiplier circuit designer 103. Place and route memory 119 stores a place and route data file produced by the datapath place and route application of digital multiplier circuit designer 103. Layout memory 125 stores a finished layout produced by digital multiplier circuit designer 103.

Referring now to FIG. 2, there is shown a block diagram of digital multiplier circuit designer 103, according to the present invention, for producing an optimized timing and layout of a digital multiplier from user specified design requirements.

User specified design requirements including a textual description of the behavior of the required digital multiplier are entered by the design engineer through keyboard 107 into user's specific configuration input receiver 211. For instance, the design engineer may specify an unsigned 24-bit by unsigned 24-bit multiplier and may further specify other constraints, such as speed, size, or load. Input receiver 211 may be compatibly written and associated input entries may be made utilizing a conventional high-level programming language, such as C or C++, and produces an output compatible with a high-level description language (HDL), such as VHDL (VHSIC HDL) which is an IEEE and U.S. Department of Defense standard, or, a register transfer language (RTL). Input receiver 211 may be conventionally implemented as with Logic Block Synthesis, a user interface design component of Concurrent Modular Design Environment (C-MDE) manufactured by. LSI Logic Corporation of California.

The user data and instructions obtained from input receiver 211 are utilized by digital multiplier design generator 221 to generate logic-level designs and models for digital multipliers compatible with the user-defined requirements. Design generator 221 further generates data and/or instructions required to generate test patterns and performance data.

Design generator 221 includes a conventional HDL and/or RTL system compiler, such as a VHDL compiler, which compiles the user specifications to generate the logic-level designs which include textual or general functional descriptions of the designed digital multipliers at the abstract behavioral level using control flow information and, at the architectural level, using data flow descriptions of the architectural partitions. Conventionally, the logic-level designs are generated in the form of behavioral and architectural description files which may be used by design generator 221 to model and simulate functional operation of the generated digital multiplier designs. Comparisons may be made by design generator 221 to determine if the architectural designs functionally match the behavioral designs and to identify errors.

The logic-level models and corresponding data and/or instructions received from design generator 221 are utilized by test pattern generator 231 to produce test pattern data comprising multiplier input and expected output values for the respective digital multiplier designs. Test pattern generator 231 is written utilizing a high-level programming language, such as C or C++, and produces an output compatible with a high-level conventional HDL, such as VHDL.

The test pattern data may be utilized by digital multiplier design generator 221 to determine if each of the proposed digital multiplier designs obtains results which are within a user specified error tolerance. Those proposed designs which fail to meet the minimum error criterion may be discarded.

The logic-level data and/or instructions from design generator 221 are utilized by performance data generator 241 to produce expected performance data including timing data for the respective proposed digital multiplier designs. Performance data generator 241 is written utilizing a high-level programming language, such as C or C++, and produces an output compatible with a conventional HDL, such as VHDL.

The performance data may be utilized by digital multiplier design generator 221 to compare various multiplier designs to determine the digital multiplier design with the fastest expected processing times. An additional evaluation may be made of each prospective design by digital multiplier design generator 221 to determine if the timing path during the performance of multiplier operations follows the critical timing path, where the timing path is defined as the time required by the time limiting operators during partial product generation, partial product columnar bit compression, and final addition stages, and, the critical timing path is defined as the time required for processing by the partial product generator, compressor, and adder. In many multiplier designs, some operators may process data in parallel with other operators and the time limiting operator may not fall on the critical path. Through the time line evaluation, time-limiting operators which do not fall on the critical path are identified and proposed solutions are evaluated by digital multiplier design generator 221. The selection of the fastest expected multiplier design following the critical timing path may be considered as an optimum solution based upon timing.

Once an optimum design multiplier solution is determined at the logic level, the logic-level data and/or instructions from design generator 221 are utilized by gate-level elements extraction generator 251 to produce a physical design including netlist for the optimum digital multiplier design. The netlist defines the connectivity of the various electrical devices comprising the respective digital multiplier physical design. In addition to producing a netlist, gate-level generator 251 also generates an output file of physical design directives associated with the physical design. The physical design directives file comprises a file containing a library of structures and rules which relate to the physical layout of the computer generated multiplier design.

Gate-level generator 251 may be implemented with a conventional netlist extraction tool, such as Schematic Compiler, which generates netlists and physical design directives files from logic-level designs or schematics. Schematic Compiler is a component of C-MDE. Alternatively, gate-level generator 251 may be implemented with Viewdesign, which accepts logic design data written in VHDL and generates corresponding netlists and physical design directives files. Viewdesign is a physical design generator manufactured by Viewlogic Systems of Massachusetts.

Similar to the evaluation process at the logic-level, the proposed physical design files may be utilized by gate-level generator 251 to simulate functional and timing performance. The results may be utilized by test pattern and performance data generators 231, 241 to produce functional and timing data which may be used by design and gate-level generators 221, 251 to determine the optimum physical design.

Once an optimum physical design has been determined, the physical design directives from gate-level generator 251 are used by datapath place and route generator 261 to generate a place and route file for the digital multiplier design. Each place and route file is combined by datapath generator 261 with the netlist to generate the physical interconnecting geometries used to produce a finished layout.

Datapath generator 261 may be implemented with a conventional place and route tool, such as Block Compiler or Datapath Placer and Router (DPPR), which place and route components and connecting conductors according to the netlist, physical design directives file, and user-defined area constraints. Block Compiler and DPPR are components of C-MDE, manufactured by LSI Logic Corporation.

Utilizing the finished layout, the operation of the digital multiplier is emulated by timing analyzer 271. Using the input values of test pattern and performance data generators 231, 251, actual timing and performance data is accumulated from the emulated design. Timing analyzer 271 may utilize a conventional Monte Carlo subroutine to obtain the actual timing and performance data. The timing performance is a function of the delays through the logic gates of the circuit, wiring capacitances, input connector drive strengths, and output connector loads. The Monte Carlo subroutine randomly varies performance of the components comprising the emulated multiplier within manufacturing tolerances to take into account variations in physical components and to obtain actual test pattern and performance results with those variations.

The actual test pattern data from timing analyzer 271 and test pattern data from test pattern generator 231 are compared and evaluated by performance data analyzer 281 to determine if the actual design functionally performs according to the user requirements. If the actual results of the designed multiplier match the predicted results, then the design is approved at the functional level. Otherwise, a next multiplier design is requested and digital multiplier circuit designer 103 re-initiates the design sequence by udpdating the design constraints and prompting digital multiplier design generator 221 to generate alternate digital multiplier design solutions. Alternatively, the digital multiplier circuit designer 103 may prompt the design engineer to change design requirements or conditions, or to provide additional instructions.

The actual performance data from timing analyzer 271 and performance data from performance data generator 241 are compared and evaluated by timing verifier 291 to determine if the actual design performs within the timing constraints specified by the user. If the actual timing results of the designed multiplier match the predicted timing results within a pre-determined tolerance, such as plus or minus 0.0001%, then the design is approved at the timing level and the design is moved forward for production of semiconductor masks. Otherwise, a next multiplier design is requested and digital multiplier circuit designer 103 re-initiates the design sequence by udpdating the design constraints and prompting digital multiplier design generator 221 to generate alternate digital multiplier design solutions. Alternatively, the digital multiplier circuit designer 103 may prompt the design engineer to change design requirements or conditions, or to provide additional instructions.

After the designed multiplier has been fully analyzed and verified, a set of wafer masks may be produced from the finished layout which in turn may be used to produce semiconductor wafers in a semiconductor manufacturing process.

Referring to FIG. 3A, an architectural block diagram of m-by-n digital multiplier 300 is shown as an example of a type of digital multiplier architecture which may be generated at the logic level by design generator 221. Digital multiplier 300 receives as input m-bit number X and n-bit number Y through respective buffers and inverters 303, 305. Partial product generator 307 generates partial products, preferably utilizing a conventional modified booth algorithm. According to the modified booth algorithm, consecutive strings of input Y are coded through recoder 309. The consecutively coded bits of input Y operate upon the m-bit input X to produce r corresponding consecutive partial products. 'r-2' compressor 311 reduces columnar-related bits from the r partial products to two bits which comprise one sum bit from the same column and one carry-out bit from the adjacent right column. The results from compressor 311 are input to adder 313 which adds the compressor results to obtain the final resultant.

The two common design optimization criteria which are used as measures of performance during design generation are circuit speed and physical design compactness. One factor on speed and size of an m-by-n digital multiplier is the length of the m- and n-bit strings which is a design constraint determined by the design engineer during entry of user's specific configuration data to input receiver 211; however once this constraint is selected, there are many different digital multipliers which may be designed to perform the operation. According to the user's specific configuration data, design generator 221 selects various multiplier algorithm blocks to generate proposed digital multiplier design solutions. The various multiplier algorithms may be selected from an algorithm library retained by mass storage 121 which may include partial product generator, compressor, and adder algorithms supporting conventional non-parallel multiplier, booth multiplier, modified booth parallel multiplier, modified booth/Wallace tree parallel multiplier, or design variations thereof. Alternatively, the type of multiplier algorithm to be implemented may be input by the design engineer to input receiver 211. The selected type of multiplier has significant ramifications upon the speed and size of the designed multiplier.

If the type of multiplier is selected by the design engineer, then during design generator 221 generates logic-level designs of digital multipliers based upon the selected algorithm and size of the m- and n-bit strings. In the case where a modified booth algorithm is to be implemented, an architectural design of digital multiplier 300 such as is shown in FIG. 3A may be generated by design generator 221.

After the architectural structure has been determined, the block components, such as partial product generator 307, r-2 compressor 311, and adder 313, may be selected by gate-level generator 251 from a component library stored in mass storage 121 or designed according to the user specifications. If multiple components are available from the component library or capable of being produced by gate-level generator 251, then the various alternative multiplier designs may be evaluated to obtain the optimum design solution based upon the design constraints. For instance, a desired optimal multiplier design may be specified by the design engineer to be the design with the fastest processing speed, the smallest silicon space requirement, the shortest total connecting conductor lengths or capacitance, the lowest power requirement, or a best scaled sum of the aforenamed factors.

In the case where the optimal design is selected based upon the shortest processing time, a proposed multiplier design may be evaluated by performance data generator 241 in terms of the sum of processing times of the various top-down component blocks. For instance with reference to FIG. 3A, the processing times of the various blocks of digital multiplier 300 are identified as t_Booth for partial product generator 307, t_WT for compressor 311, and t_FA for adder 313, and, the total time t_mxn to perform the m- by n-bit multiplication operation where t_mxn=t_Booth+t_WT+t_FA.

Each compatible component or combination of components satisfying the requirements of partial product generator 307 may be alternately implemented by gate-level generator 251, evaluated for speed by performance data generator 241 and compareded for the fastest t_booth speed by design generator 221. For instance in the case of an unsigned 24- by 24-bit digital multiplier shown in FIG. 3B, partial product generator 307 may be initially implemented at the logic level by design generator 221 utilizing a modified Booth algorithm which generates a series of 14 partial product rows (shown in FIG. 4) from the multiplication of 24-bit input X by the least significant 12 bits of input Y, and thereafter at the physical design level by gate-level generator 251. Each row of p's represents a partial product obtained from the multiplication of 24-bit wide input X by consecutive, single bits of input Y and has a 26-bit width. An additional row of a's follows the 12 rows of p's and has a 24-bit width. The row of a's is determined in accordance with the Booth algorithm and is utilized with unsigned multiplication operations. Additionally, a series of 12 placeholder bits 'x' are consecutively introduced below the least significant partial product bit of the previous row in order to correct each partial product row by a single bit. Finally, a row of constant 1's are included to avoid long sign extension. Thus, 14 rows are obtained from the multiplication of the least signicant bits of input Y (and correspondingly, from multiplication of the most significant bits of input Y) with 24-bit input X. Each subsequent row of partial products is offset by two bits from the least significant bit of the prior partial product row and yields a parallelogram shape referred to as a Wallace Tree.

If at the logic level, a logic design model with the modified Booth algorithm is determined by design generator 221 to be the optimum digital multiplier design according to the user-defined constraints, then proposed physical designs are generated by gate-level generator 251 from the component library.

Similarly, each compressor algorithm accessible from the algorithm library is proposed by design generator 221, evaluated by test pattern and performance data generators 231, 241, and, the best performing compressor algorithm compatible with the partial product generator block is selected by design generator 221 for compressor 311. Compatible, physical component or combinations of components satisfying the algorithmic requirements of compressor 311 are alternately implemented by gate-level generator 251, the proposed physical designs are tested by test pattern and performance data generators 231, 241, and, the physical compressor design with the fastest t_WT speed determined by design generator 221 is selected. For instance in the case of an unsigned 24- by 24-bit digital multiplier, 'r-2' compressor 311 of FIG. 3A may be physically implemented by gate-level generator 251 utilizing a network of 4-2 compressors 501 as shown in FIG. 5A to reduce each column of partial products to two bits comprising one sum bit from the same column and one carry-out bit from the adjacent right column, where the component library contains the design information of 4-2 compressor 501 as shown in FIG. 5B.

In order to compress r columnar partial product bits including correction bits at least k levels (stages) of 4-2 compressors 501 are required, where k is the smallest number satisfying the algorithm r<=$2^{k+1}$. Application of this algorithm by gate-level generator 251 yields the requirement that at least three stages 511, 513, 515 of 4-2 compressors 501 be implemented to process at most fourteen columnar partial product bits. In fact at least three stages 511, 513, 515 of 4-2 compressors 501 are needed to process nine bits or more. With reference to FIG. 4, columns with nine bits or more, and therefore requiring three stages 511, 513, 515 of 4-2 compressors 501, are determinable by gate-level generator 251 to be generated in columns fourteen through forty-seven. Although columns thirty-five and higher do not require all three stages 511, 513, 515 of 4-2 compressors 501, three stages are utilized by gate-level generator 251 for columnar compression to assist in processing bits due to carry-outs generated by the near-right column and enhancing speed of processing.

Additionally with reference to FIG. 4, the most-significant bits of all partial products are inverted by the partial product generating algorithm. Gate-level generator 251 may determine to eliminate a further inversion stage and corresponding additional processing time prior to compressing respective columns, by connecting the inverted bits to the 'x4' input of the respective compressors since the 'x4' input is connected directly to upperbound adder 317.

Similar to the above processing, after design generator 221 determines the optimum logic level adder algorithmic solution, each compatible component or combination of components satisfying the adder algorithmic requirements of adder 313 may be alternately implemented by gate-level generator 251, tested for functionality and speed by test and performance generators 231, 241, and evaluated for the fastest t_FA speed by design generator 221. For instance, adder 313 may be implemented at the logic level by design generator 221 as a single adder which adds all the compressed results after all partial products are generated and columnar compressed. Alternatively, adder 313 may be implemented as a two stage adder including lowerbound adder 315 and upperbound adder 317 as shown in FIG. 3B for respectively adding least significant and most significant compressed columnar partial product bits. By performing the addition of least significant compressed columnar partial product bits while the most significant columnar partial product bits are being compressed, the processing time t_FA is reduced to principally the addition of most significant compressed columnar partial product bits by upperbound adder 317. Each of the proposed designs are evaluated by design generator 221 at the logic level, then the best choice according to the user specifications is passed forward as an optimum solution. From the optimum logic level solution, a physical design solutions are generated by gate-level generator 251, and the best physical design is passed forward for further processing.

With continued reference to FIG. 3B, a design requirement for digital multiplier 300 to perform an unsigned 24-bit input X by unsigned 24-bit input Y utilizing a modified Booth algorithm may be designed to obtain Wallace Tree 319 of 14 partial products as discussed above. Lowerbound adder 315 may be generated by gate-level generator 251 to include a first stage comprising 2-bit parallel adder 321 which may be implemented to sum the two least significant columns of the Wallace Tree upon the generation of the first two partial products since no compression is needed for the first two partial product bit columns. Lowerbound adder 315 may further include a second, third and fourth stage respectively comprising 4-bit parallel adders 323, 325, 327 for summing the next twelve least significant compressed partial product bit columns at the rate of four columnar bits per stage. Finally, upperbound adder 313 is implemented by gate level generator 251 to sum the remaining thirty-four compressed partial product bit columns. Once summation is completed, the forty-eight bit solution is accumulated from the respective adders 317, 327, 325, 323, 321.

Referring to FIG. 5C, upperbound adder 313 is shown comprising 34-bit carry look-ahead adder (LAC) 551 as may be generated by gate-level generator 251. Once gate-level generator 251 determines a need for LAC 551, generator 551 accesses the component library to determine if the entire physical design is available. If not, generator 551 accesses the component library to determine those components which are available that may be used to synthesize LAC 551. The component library may include descriptions for an 8-bit LAC 561 and 4-bit LAC. Since LAC 551 includes one stage of four 8-bit LACs 561 followed by one 4-bit LAC, the 34-bit LAC could be synthesized by generator 251.

Although, the above-referenced design solution may yield a functionally correct solution, optimization requires that the limiting speed of digital multiplier 300 follow critical path 331 (FIG. 3A). This requirement places a design constraint upon parallel operations such as that performed by lowerbound adder 315. In order for lowerbound adder 315 to provide an optimum benefit to the overall system, the summation performed by lowerbound adder 315 should be accomplished prior to the completion of compressor 311. Hence, once a proposed design for digital multiplier 300 has been completed, design generator 221 evaluates the time line path. If the time line path does not fall upon the critical path then the lowerbound adder 315 requires more time than compressor 311. Design generator 221 then evaluates whether alternative faster components are available for synthesis of lowerbound adder 315 and if not then must re-design lowerbound adder 315 so that the time required by lowerbound adder 315 does not exceed the time required for compressor 311.

Referring to FIG. 6, a design of digital multiplier 300 is shown as may be produced by automated design system 101 for an unsigned 24-bit input X by unsigned 24-bit input Y wherein the time line path matches critical path 331 and total time t_u24×u24=t_Booth+t_WT+t_FA. Times are analyzed by automated design system 101 and a design is selected based upon the optimum combination of components such that the lowest total time is achieved. Automated design system 101 evaluates the time for processing partial product block 611 as t_Booth=max(t_Xbuffer+t_PPfull, t_Ybuffer+t_recoder+t_PPlower) where t_Xbuffer equals the time for processing input X through buffer inverter 303, t_PPfull equals the time for processing buffered inputs X and Y through partial product generator 307, t_Ybuffer equals the time for processing input Y through buffer inverte 305, t_recoder equals the time for processing buffered input Y through recoder 309, and t_PPlower equals the time for processing buffered input X with the least significant bits of buffered input Y through partial product generator 307.

Design generator 221 evaluates the time for processing compressor block 621, t_WT=3×t_4-2 where t_4-2 equals the maximum time for processing partial product columnar bits through one of the compressor stages 511, 513, 515. Design generator 221 evaluates the time for processing adder block 631, t_FA equal to the time for processing the uppermost compressed columnar partial product bits through 34-bit parallel adder 317. Since the design criterion includes the requirement that the time line follow critical path 331, the time for adding the two lowermost columnar partial product bits with 2-bit adder 321, adding the next lowermost four compressed columnar partial product bits with 4-bit adder 323, and adding the next lowermost eight compressed columnar partial product bits with 8-bit adder 641 is determined by design generator 221 not to delay output of the multiplied result, since the processing for lowermost adder 315 comprising adders 321, 323, 641 occurs entirely in parallel with the processing of partial product and compressor blocks 611, 621.

To optimize compactness in the placement and routing process, digital multiplier designer 103 implements a series of placement rules through datapath place and route generator 261. With reference to FIG. 7, layout 700 is shown as produced by datapath generator 261 for the above-described unsigned twenty-four by unsigned twenty-four digital multiplier according to a series of placement rules. The placement rules include primarily ordering elements in each row according to the corresponding data set defined by the output nets of those elements. With respect to buffers 303, 305, the inverters and buffers of buffer 303 are placed in rows 701 while the corresponding inverters and buffers of buffer 305 are grouped as anti-social elements which are placed according to convenience. With respect to partial product generator 307, every four consecutive partial product generators are grouped and closely packed in partial product rows 711, 713, 715. Respective, grouped partial products are aligned two columns (corresponding to bits) off each other. Booth recording elements are grouped as anti-social elements due to constraints upon row height and width. With respect to 'r-2' compressor 311, Wallace Tree rows 721, 723, 725, 727, 729, 731 are placed adjacent to and immediately following partial product rows generating respective columnar bits. Compressor 501 (designated 'a' in FIG. 5A) of first compressor stage 511 is placed on row 721 immediately following row 711, which produces the first four partial products 0–3 and inputs for compressor 501a from the first four (least significant) columnar bits 0–3. Following row 713, compressors 501 (designated 'b' and 'd' in FIG. 5A) of first and second compressor stages 511, 513 are placed on rows 723, 725 immediately following row 713, which produces the next four partial products 4–7 and inputs for compressor 501b from the next four (least significant) columnar bits 4–7. In turn, output signals from compressors 501a, 501b are utilized as input signals to compressor 501d which is placed on the next successive row 725. Following row 715, compressors 501 (designated 'c', 'e', and 'f' in FIG. 5A) of first, second, and third compressor stages 511, 513, 515 are placed respectively on rows 727, 729, 731 immediately following row 715, which produces the next four partial products 8–11 and inputs for compressor 501c from the next four (least significant) columnar bits 8–11. In turn, output signals from compressor 501c and placeholder partial product rows 'a' and '1' are utilized as input signals to compressor 50ie which is placed on the next successive row 727. Next, output signals from compressors 501d and 501e are utilized as input signals to compressor 501f which is placed on the next successive row 729. With respect to adder 313, upperbound adder 317 is placed on row 741 immediately adjacent to and following row 731 containing compressor 501 (designated 'f' in FIG. 5A) of third stage 515. Components of lowerbound adder 315 are categorized as anti-social elements. With reference to anti-social elements, those elements which are not over-sized may be annealed near to selected area or elements; however, those anti-social elements which are over-sized generally should be annealed unrestrictedly.

Prior to finalizing the design and with reference again to FIG. 2, the finished layout is emulated by timing analyzer 271 to obtain actual timing and performance data on the digital multiplier. The actual functional data is compared with the functional data obtained from the physical design by test pattern generator 231 and evaluated for functional correctness by performance data analyzer 281. The actual timing data is compared with the timing data obtained from the physical design by performance data generator 241 and compared by timing verifier 291. Test results are assessed with respect to user defined constraints and are fed back to design generator 221 in the event that the layout fails to meet the defined constraints. By sending test results back to design generator 221, optimization of the finished layout can be performed by making changes at design generator 221 and re-initiating the design process.

What is claimed is:

1. An automated method for designing an optimized digital multiplier, the method comprising:

specifying an optimizing criterion for a timing characteristic of said digital multiplier;

generating plural alternative digital multiplier logic-level designs in response to said optimizing criterion, wherein each of digital multiplier logic-level designs meets pre-specified design constraints and has functional blocks which are operable in parallel;

determining the timing characteristic for each of functional blocks of each of said plural alternative digital multiplier designs;

determining a critical processing flowpath for each of said plurality of digital multiplier designs with the timing characteristic of each of respective functional blocks;

eliminating any of said plurality of digital multiplier designs which are without a timing characteristic substantially matching said optimizing criteria;

selecting one of said plural alternative digital multiplier logic-level designs having timing characteristic most closely matching said optimizing criterion;

producing a netlist for said selected digital multiplier design;

analyzing said selected digital multiplier design at a netlist level to determine whether said multiplier timing characteristic satisfies said optimizing criterion;

producing a layout for said selected digital multiplier design including generating plurality of digital multiplier physical designs;

analyzing said selected digital multiplier design at a layout level to determine whether said multiplier timing characteristic satisfies said optimizing criterion; and selecting another digital multiplier design among said plural alternative digital multiplier designs if said multiplier timing characteristic at the layout level does not satisfy said optimizing criterion.

2. The method according to claim 1 for designing said optimized digital multiplier, wherein the generating step includes the steps of:

generating an initial logic-level multiplier design comprising at least one functional block;

determining availability of any alternative functional blocks which are alternatives to said at least one functional block; and generating a plurality of alternative logic-level digital multiplier designs each with at least one of said any alternative functional blocks.

3. The method according to claim 1 for designing said optimized digital multiplier, wherein the generating step includes the steps of:

generating a physical design comprising at least one physical component;

determining availability of any alternative physical components which are alternatives to said at least one physical component; and generating a plurality of alternative physical-level digital multiplier designs each with at least one of said any alternative physical components.

4. The method according to claim 1 for designing said optimized digital multiplier wherein each of said digital multiplier logic-level designs has a critical processing flowpath through respective components, the generating step includes the step of generating said plurality of alternative digital logic-level multiplier designs each having functional blocks which are operable in parallel;

the determining step includes the step of determining the respective timing characteristic for each functional block;

determining a critical processing flowpath for each of said plurality of digital multiplier logic-level designs with the timing characteristics of each respective functional block; and eliminating any of said plurality of digital multiplier designs which are without a timing characteristic substantially matching said optimizing criteria.

5. The method according to claim 1 for designing said optimized digital multiplier wherein the determining step includes utilizing a benchmark test to access the timing characteristic of each of said plurality of alternative digital multiplier logic-level designs.

6. The method according to claim 3 for designing said optimized digital multiplier, wherein the determining step includes utilizing a benchmark test to access the timing characteristic of each of said plurality of alternative physical-level digital multiplier designs.

7. The method according to claim 5 for designing said optimized digital multiplier, wherein the step of generating said plurality of digital multiplier physical designs includes the steps of:

generating a digital multiplier physical design comprising at least one physical component;

determining availability of any alternative physical components; and generating a plurality of alternative digital multiplier physical designs each with at least one of said any alternative physical components.

8. The method according to claim 7 for designing said optimized digital multiplier, wherein each of said plurality of alternative digital multiplier physical designs has a critical processing flowpath through respective components;

the digital multiplier physical design generating step includes generating a plurality of digital multiplier physical designs each having components which are operable in parallel;

the digital multiplier physical design determining step includes determining the timing characteristic for each component;

determining a timing characteristic for each of said plurality of digital multiplier physical designs with the timing characteristics for each respective component; and eliminating any of the plurality of digital multiplier physical designs which are without matching timing characteristics substantially matching said timing characteristic.

9. A storage medium containing an instruction set readable on a data processing device for designing an optimized digital multiplier, the instruction set including the following steps:

specifying an optimizing criterion for a timing characteristic of said digital multiplier;

in response to said optimizing criterion, generating a plurality of alternative digital multiplier logic-level designs meeting pre-specified design constraints, each of digital multiplier designs having functional blocks which are operable in parallel;

determining the timing characteristic for each of functional blocks of each of said plurality of digital multiplier designs, selecting one of said plurality of digital multiplier logic-level designs which provides said one multiplier timing characteristic most closely matching the optimizing criterion;

determining a critical processing flowpath for each of said plurality of digital multiplier designs with the timing characteristic of each of respective functional blocks;

eliminating any of said plurality of digital multiplier designs which are without a timing characteristic substantially matching said optimizing criteria;

producing a netlist for said selected digital multiplier design;

analyzing said selected digital multiplier design at a netlist level to determine whether said multiplier timing characteristic satisfies said optimizing criterion;

producing a layout for said selected digital multiplier design;

analyzing said selected digital multiplier design at a layout level to determine whether said multiplier timing characteristic satisfies said optimizing criterion; and selecting another digital multiplier design among said plural alternative digital multiplier designs if said multiplier timing characteristic at the layout level does not satisfy said optimizing criterion.

10. The storage medium according to claim 9 for designing said optimized digital multiplier, wherein the generating step includes;

generating a digital multiplier design comprising at least one component block;

identifying any alternative component blocks which are alternatives to said at least one component block;

generating a plurality of alternative digital multiplier designs each with at least one of said any alternative component blocks;

identifying a critical processing flowpath through respective component blocks of each of said plurality of digital multiplier designs;

identifying component blocks of the plurality of digital multiplier designs which are operable in parallel;

determining a respective timing characteristic for each component block; and determining a timing characteristic for each of said plurality of digital multiplier designs with the timing characteristics of the respective blocks.

11. The storage medium according to claim 9 for designing said optimized digital multiplier wherein the generating step includes eliminating any of the plurality of digital multiplier designs which are without a respective timing characteristic substantially matching said optimizing criteria.

12. The storage medium according to claim 10 for designing said optimized digital multiplier wherein the generating step includes the steps of:

generating a digital multiplier physical design comprising at least one physical components;

determining availability of any alternative physical components which are alternatives for said at least one physical component; and generating a plurality of alternative digital multiplier physical designs each with at least one of said any alternative physical components.

13. The storage medium according to claim 12 for designing said optimized digital multiplier wherein each of said digital multiplier physical designs has a critical processing flowpath through respective components, the physical design generating step includes generating a plurality of physical designs each having components which are operable in parallel;

the physical design determining step includes determining the respective timing characteristic for each component;

determining a timing characteristic for each of said plurality of digital multiplier physical designs with the respective timing characteristics of each respective component; and eliminating any of the plurality of digital multiplier physical designs which are without timing characteristics substantially matching said optimizing criteria.

14. An automated design system for producing an optimized digital multiplier design, the design system including:

a data processor, the data processor including:

means for receiving an optimizing criterion for a timing characteristic of said digital multiplier;

means responsive to said optimizing criterion for generating a plurality of alternative digital multiplier logic-level designs wherein each of digital multiplier logic-level designs substantially meeting pre-specified design constraints and having functional blocks which are operable in parallel, the pre-specified design constraints including an optimizing criterion for at least one multiplier timing characteristic;

means for determining the timing characteristic for each of functional blocks of each of said plurality of digital multiplier designs;

means for determining a critical processing flowpath for each of said plurality of digital multiplier designs with the timing characteristic of each of respective functional blocks;

means for eliminating any of said plurality of digital multiplier designs which are without a timing characteristic substantially matching said optimizing criterion;

means for selecting one of said plurality of digital multiplier designs which provides said one timing characteristic most closely matching the optimizing criterion;

means for producing a netlist for said selected digital multiplier design;

means for analyzing said selected digital multiplier design at a netlist level to determine whether said multiplier timing characteristic satisfies said optimizing criterion;

means for producing a layout for said selected digital multiplier design;

means for analyzing said selected digital multiplier design at a layout level to determine whether said multiplier timing characteristic satisfies said optimizing criterion; and means for selecting another digital multiplier design among said plural alternative digital multiplier designs if said multiplier timing characteristic at the layout level does not satisfy said optimizing criterion.

15. The design system according to claim 14 for designing said optimized digital multiplier, wherein the generating means includes;

means for generating a digital multiplier design comprising at least one component block;

means for determining availability of any alternative component blocks which are alternatives to said at least one component block; and means for generating a plurality of alternative digital multiplier designs each with at least one of said any alternative component blocks.

16. The design system according to claim 15 for designing said optimized digital multiplier wherein each of said plurality of digital multiplier designs has a critical processing flowpath through respective component blocks, the generating means includes means for generating a plurality of digital multiplier designs each having functional blocks which are operable in parallel;

the determining means includes means for determining the respective timing characteristic for each functional block;

means for determining a timing flowpath for each digital multiplier design with the timing characteristics of each respective functional block;

means for eliminating any of the plurality of digital multiplier designs which are without a timing characteristic substantially matching said optimizing criteria.

17. An automated method for designing a digital multiplier, comprising the steps of:

specifying an optimizing criterion having functional and timing requirements for said digital multiplier using a high-level programming language;

generating a high-level or register-level description of the digital multiplier design based on said functional and timing requirements in said high-level programming language, wherein said multiplier design has functional blocks which are operable in parallel;

generating logic-level designs for a plurality of proposed digital multiplier designs that are compatible with the functional and timing requirements for each of functional blocks of said digital multiplier design as specified in said high-level or said register level description;

determining a critical processing flowpath for each of said plurality of digital multiplier designs with the timing requirement of each of respective functional blocks; and eliminating any of said plurality of digital multiplier designs which are without a timing requirement substantially matching said optimizing criterion;

selecting an optimum digital multiplier logic level design among said proposed digital multiplier designs that best matches the functional and timing requirements at the logic level for each of functional blocks of an optimum digital multiplier logic-level design using logic-level test pattern data and timing data;

generating a netlist and physical design directives for said optimum digital multiplier design;

simulating functional and timing performance for said optimum digital multiplier design at the netlist level using netlist level test pattern data and expected timing data;

generating a layout for said optimum digital multiplier design using said netlist and said physical design directives for said optimum digital multiplier design;

generating layout-level timing data for optimum digital multiplier design; and comparing said layout-level timing data of said optimum digital multiplier design with expected timing data generated by a performance data generator.

18. An automated design system for producing a desired digital multiplier design, comprising:

an input receiver for receiving a textual description of user-specified optimizing criterion having functional and timing requirements for said desired digital multiplier design in a high-level programming language, and for outputting a high-level or register level description of said functional and timing requirements of said desired digital multiplier design, wherein said desired multiplier design has functional blocks which are operable in parallel;

a test pattern generator for generating test pattern data including input and expected output values for selected digital multiplier designs;

a performance data generator for generating expected timing data for selected digital multiplier designs;

a digital multiplier design generator for generating logic-level designs for a plurality of proposed digital multiplier designs that are compatible with the functional and timing requirements for each of functional blocks of said desired digital multiplier design as specified in said high-level or said register level description, and for selecting an optimum digital multiplier logic level design among said proposed digital multiplier designs that best matches the functional and timing requirements at the logic level of said desired digital multiplier design using logic-level test pattern data and timing data generated by said test pattern generator and said performance data generator; for determining a critical processing flowpath for each of said plurality of digital multiplier designs with the timing requirements of each of respective functional blocks; and for eliminating any of said plurality of digital multiplier designs which are without a timing requirement substantially matching said optimizing criterion;

a gate-level extraction generator for generating a netlist and physical design directives for said optimum digital multiplier design, and for simulating functional and timing performance for said optimum digital multiplier design at the netlist level using netlist level test pattern data and netlist-level expected timing data;

a datapath place and route generator for generating a layout for said optimum digital multiplier design using said netlist and said physical design directives for said optimum digital multiplier design;

a timing analyzer for generating layout-level timing data for optimum digital multiplier design; and a performance data analyzer for comparing said layout-level timing data of said optimum digital multiplier design with expected timing data generated by said performance data generator.

* * * * *